United States Patent
Jacob et al.

(10) Patent No.: US 7,601,560 B2
(45) Date of Patent: Oct. 13, 2009

(54) METHOD FOR PRODUCING AN ELECTRONIC CIRCUIT

(75) Inventors: Wolfgang Jacob, Horb (DE); Christoph Ruf, Eningen (DE); Albert-Andreas Hoebel, Reutlingen (DE); Rolf Becker, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 56 days.

(21) Appl. No.: 11/575,586

(22) PCT Filed: Nov. 28, 2005

(86) PCT No.: PCT/EP2005/056277

§ 371 (c)(1),
(2), (4) Date: Mar. 20, 2007

(87) PCT Pub. No.: WO2006/072512

PCT Pub. Date: Jul. 13, 2006

(65) Prior Publication Data

US 2007/0231968 A1    Oct. 4, 2007

(30) Foreign Application Priority Data

Dec. 30, 2004   (DE) ...................... 10 2004 063 851

(51) Int. Cl.
  *H01L 21/00*   (2006.01)
  *H01L 23/495*  (2006.01)
(52) U.S. Cl. ...................... 438/108; 438/123; 257/676; 257/E21.523
(58) Field of Classification Search ................. 438/108, 438/123; 257/676
See application file for complete search history.

(56) References Cited

U.S. PATENT DOCUMENTS

| 5,032,691 A * | 7/1991 | Kaufman .................... 174/559 |
| 6,072,240 A | 6/2000 | Kimura et al. |
| 6,411,536 B1 | 6/2002 | Thor et al. |
| 6,541,352 B2 * | 4/2003 | Wachtler .................... 438/460 |
| 7,069,653 B2 | 7/2006 | Topp et al. |
| 2003/0168252 A1 * | 9/2003 | Schmid et al. .............. 174/260 |
| 2004/0061221 A1 * | 4/2004 | Schaffer .................... 257/723 |

FOREIGN PATENT DOCUMENTS

| DE | 199 12 443 | 10/2000 |
| DE | 199 46 259 | 3/2001 |
| DE | 100 38 092 | 2/2002 |

* cited by examiner

*Primary Examiner*—Matthew C Landau
*Assistant Examiner*—Daniel Luke
(74) *Attorney, Agent, or Firm*—Michael J. Striker

(57) ABSTRACT

The invention relates to a method for producing an electronic circuit. According to said method, two semiconductor chips (46) with essentially the same structure are mounted on a surface (13) pertaining to a first conductor carrier (10) and coated with strip conductors (16). Said two semiconductor chips (46) comprise a first surface (49) and a second surface (58), one semiconductor chip (46) being mounted on the conductor carrier surface (13) with the first surface (49) thereof, and the other semiconductor chip (46) being mounted on the conductor carrier surface (13) with the second surface (58) thereof. The second surface (58) of the first semiconductor chip (46) and the first surface (49) of the other semiconductor chip (46) are interconnected by a lead frame (64) with an A.C. power supply (31).

5 Claims, 6 Drawing Sheets

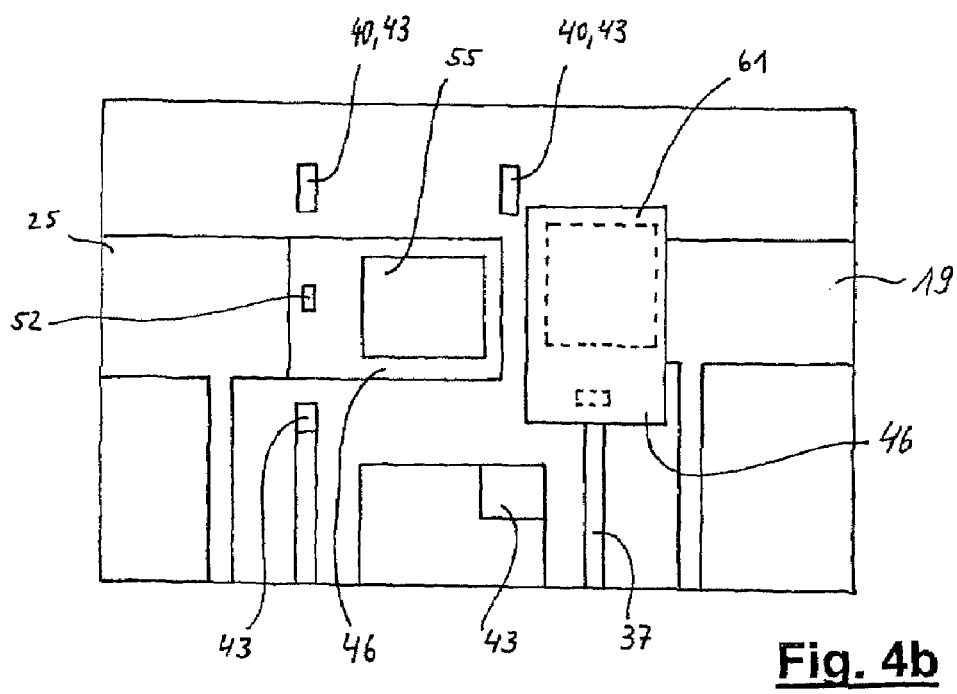
Fig. 4b
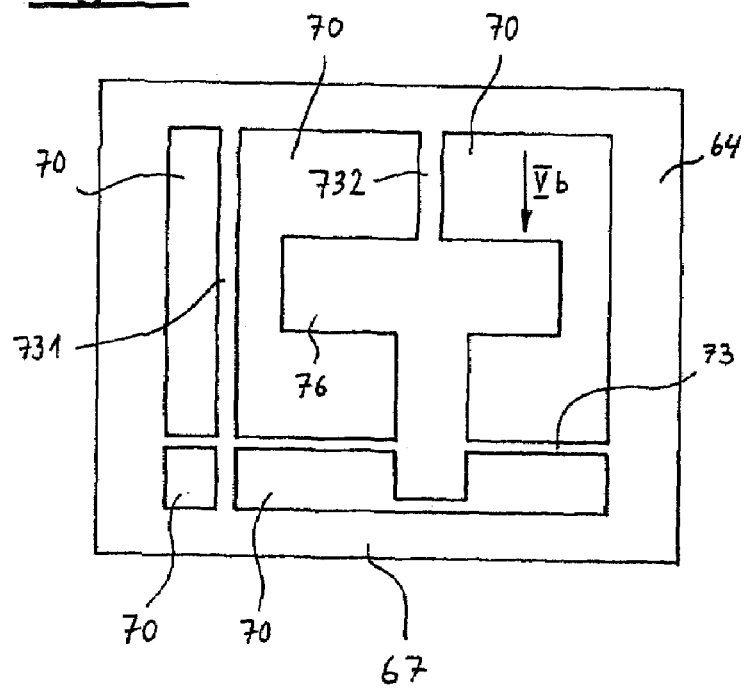
Fig. 5a
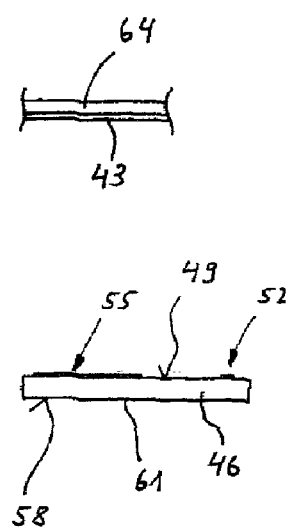
Fig. 5b
Fig. 4a

METHOD FOR PRODUCING AN ELECTRONIC CIRCUIT

CROSS-REFERENCE TO A RELATED APPLICATION

The invention described and claimed hereinbelow is also described in German Patent Application DE 10 2004 063 851.9 filed on Dec. 30, 2004. This German Patent Application provides the basis for a claim of priority of invention under 35 U.S.C. 119(a)-(d).

BACKGROUND OF THE INVENTION

In electronic control devices, the unhoused semiconductors are soldered—with increased power loss—together with a few passive components on a power substrate designed for a specific application. The preferred substrate material currently in use is a DBC (direct bonded copper) ceramic substrate. The power semiconductor components are soldered onto it. The source and drain connections of the power semiconductors are then contacted with the strip conductors of the power substrate using aluminum thick wire bond connections. The connections with the plastic-coated parts of the control device housing to be inserted are also created using thick aluminum wire bonds. Multiple bonds are typically required in order to conduct the current intensities required for specific applications. When this assembly technique is used, the only way to release the dissipation heat produced in the power semiconductors is via the underside of the chip.

The thick aluminum wire bonds described above have the following two disadvantages: A particularly large number of bonds is required, and they must be formed in succession. As a result, this portion of the manufacturing procedure is particularly time-consuming. A further disadvantage of these thick aluminum wire bonds is that they have limited capability of dissipating heat from the power semiconductors.

SUMMARY OF THE INVENTION

The inventive method has the advantage that the two semiconductor chips are interconnected by a lead frame on the side opposite to the conductor surface and, therefore, heat can be dissipated particularly well via this lead frame. A further advantage is that the connection of the lead frame with the two semiconductor chips can be created using a soldering process. This soldering process corresponds to the connection method used to connect the chips to the strip conductors of the first conductor carrier. Therefore, the chips are connected with the strip conductors and the lead frame is connected with the semiconductor chips in the same method step. This saves time, because the complicated bonding step is eliminated, and improved heat dissipation is achieved, since the lead frame conducts the heat particularly well.

According to a further embodiment of the present invention, it is provided that, immediately after the lead frame is mounted on the semiconductor chips, connections that serve no purpose in the circuit (i.e., short circuits) result between various contact points. Connections of this type are intended to mean that these connections would result in short-circuits during operation of the electronic circuit. Accordingly, it is provided in a further step of the present invention that the connections that serve no purpose in the circuit, i.e., the short-circuit connections, are severed in a subsequent step.

To ensure that the lead frame rests securely on the first conductor carrier over a particularly large surface area, it is provided that the lead frame is supported on support points that are not integrated in the electronic circuit.

A lead frame can be manufactured particularly easily when it is designed as a metallic punched grid. Particularly good compatibility of the lead frame with the coated first conductor carrier is given when the lead frame—like the first conductor carrier—is composed of a second conductor carrier coated with strip conductors. The first and second conductor carriers can be made of the same material, for example.

To ensure good adhesion and a good connection between the strip conductors on the first conductor carrier and the semiconductor chips, it is provided that the source and gate connections located on the second surfaces of the semiconductor chips are metallized before they are positioned on the first conductor carrier.

An exemplary embodiment of the inventive method is shown in the drawing.

BRIEF DESCRIPTION OF THE DRAWINGS

FIGS. 2 through 8 are top views of a first conductor carrier after certain method steps have been carried out.

DESCRIPTION OF THE PREFERRED EMBODIMENT

Figure 1:
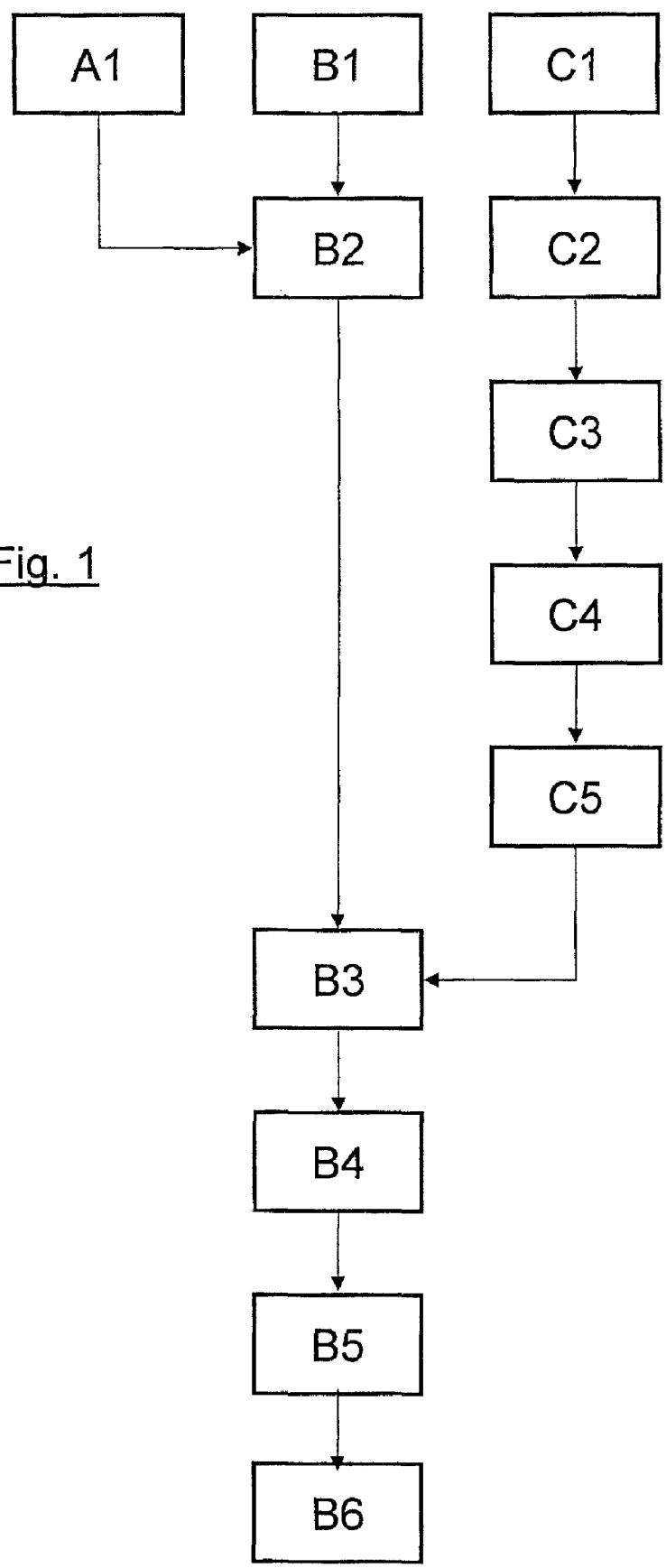
FIG. 1 is a schematic depiction of the method for manufacturing the electronic circuit.

A flow chart of the manufacturing method is shown schematically in FIG. 1. The sequence of steps in the method depicted in FIG. 1 is described in greater detail with reference to FIGS. 2 through 7.

Figure 2:
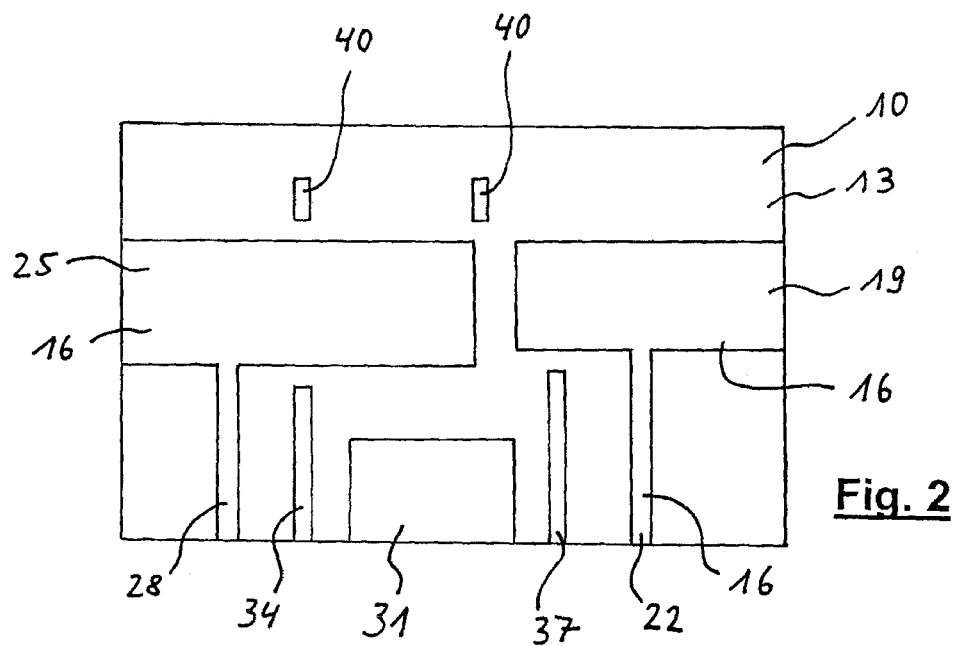

FIG. 2 shows a first conductor carrier, which is designed as a DBC ceramic substrate in this case. On its surface 13, conductor carrier 10 has non-conductive areas and conductive areas, which are referred to here as strip conductors 16. Strip conductors 16 shown in FIG. 2 serve various purposes in this case. The region furthest to the right will eventually serve as a negative connection 19. A strip conductor 16 extends as one piece—designed as a "negative sense line" 22—out of negative connection 19, the remainder of which has a relatively large surface area. A strip conductor 16 that will eventually serve as positive connection 25 is located opposite to negative connection 19. A "positive sense line" 28 extends out of connection 25. A strip conductor 16 that serves as an A.C. power supply connection 31 is also shown on the surface of conductor carrier 10. Located on one side of A.C. power supply connection 31 is a "gate 1" connection 34, and, on the right-hand side, a "gate 2" connection 37, designed as strip conductors 16. In this case, two support surfaces 40 are also located on surface 13 of conductor carrier 10. Support surfaces 40 serve initially only as strip conductors 16, but they are electrically isolated from the other strip conductors.

A soldering paste is applied to the surface of a first conductor carrier 10—which has been prepared accordingly—in step B1 (see FIG. 1), i.e., to selected surface regions of strip conductors 16. Soldering paste 43 can be applied to the surface using screen printing. After first step B1, soldering paste 43 is located on support surfaces 40, negative connection 19, positive connection 25, gate 1 connection 34, gate 2 connection 37, and A.C. power supply connection 31. A side view of semiconductor chip 46 is shown in FIG. 4a. Semiconductor chip 46 has two surfaces: First surface 49 is the surface on which gate connection 52 and source connection 55 are located. Second surface 58 is the surface opposite to first surface 49. Second surface 58 also carries drain connection 61. According to FIG. 1, method step A1 is also used on a semiconductor 46 of this type. In so doing, source connection 55 and gate connection 52 are provided with "under-bond metallization". According to step B2, FIG. 1, two semiconductor chips 46 are now placed on certain strip conductors 16 of conductor carrier 10. A first semiconductor chip 46 is placed—via its second surface 58—on positive connection 25 or in the region of positive connection 25, which is covered with soldering paste 43. First semiconductor 46 now faces away from surface 13 with gate connection 52 and source connection 55.

Figure 3:
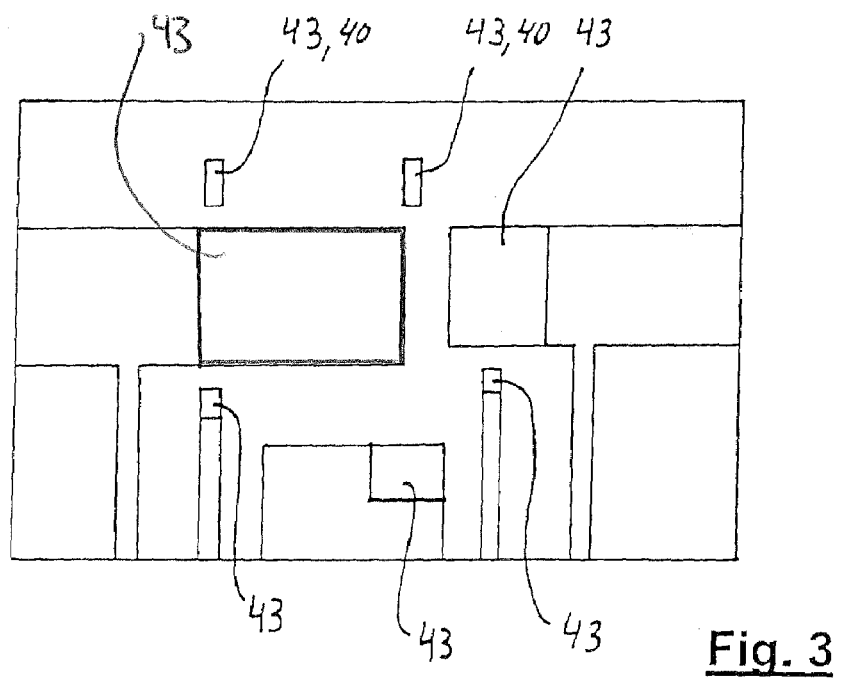
Figure 6:
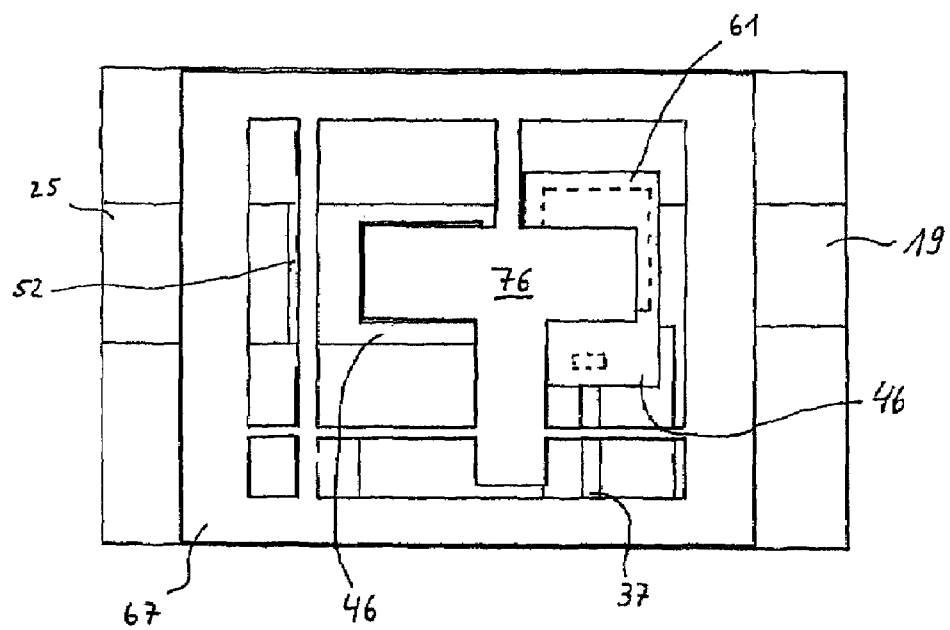

Positive connection 25 is depicted as a straight, wide strip conductor 16 in FIGS. 2, 3 and 4*b*. Gate 1 connection 34, which is also designed as strip conductor 16, extends at a right angle to positive connection 25. Gate 1 connection 34 extends at a right angle into the vicinity of the boundary of positive connection 25. A support surface 40, the surface of gate 1 connection 34 coated with soldering paste 43, and gate connection 52 of semiconductor 46 lying on positive connection 25 lie on a line in this exemplary embodiment. The other semiconductor 46 lies with its source connection 55 on the region of negative connection 19 coated with soldering paste 43. Gate connection 52 of second semiconductor 46 lies on gate 2 connection 37 or the region of gate 2 connection 37 coated with soldering paste 43.

A top view of a lead frame 64 is shown in FIG. 5*a*. In the example, lead frame 64 shown in FIG. 5*a* is a punched grid that has been punched out of a metal plate, e.g., a copper plate. According to method step C1, FIG. 1, a layer of soldering paste 43 is applied to lead frame 64 on the side that will come in contact with semiconductors 46. Soldering paste 43 is also applied using screen printing, for example. In a reflow soldering step (C2), soldering paste 43 is liquified and then hardened via cooling. In an optional intermediate step C3, several connected lead frames 64 can be separated. This applies when lead frames 64 are punched out of one large, continuous plate. This separation is carried out, e.g., by punching away or severing the segments that connect adjacent lead frames 64. For the case when certain sections of lead frame 64 are designed to eventually extend with marked elevation across strip conductors 16 of conductor carrier 10, individual sections of lead frame 64 can be punched, so that these particular individual sections extend over individual connecting points in the manner of bridges. In a further method step C5, which typically follows one of the steps described above, lead frame 64—with soldering paste 53 on the top—is flipped over. With soldering paste 43 now facing downward, lead frame 64 is immersed briefly in flux (step C5).

Lead frame shown in FIG. 5*a* has various sections. For example, lead frame 64 initially has a frame 67 that is actually closed overall and is annular in shape. Windows 70 are located in frame 67, and are positioned such that various segments 73 remain. For example, a segment 73.1 is provided to eventually interconnect a support surface 40, a gate connection 52, and gate 1 connection 34. A connector 76 located in the middle of frame 64 will eventually serve to connect a source connection 55 with a drain connection 61 and A.C. power supply connection 31. A further connector 73.2, located between frame 67 and connector 76, will eventually serve only to connect connector 76 with a support surface 40 in a manner such that connector 76 is supported well over the individual electronic components. In a further step B3, lead frame 64 shown in FIG. 5*a* is placed on conductor carrier 10—which has been prepared in a suitable manner—thereby resulting in the connection points described above. In a further step B4, lead frame 64—which, ideally, has been specially coated with soldering paste 43 only on the contact points—is joined in a vacuum soldering step with the strip conductors and the various connections of semiconductors 46. In an optional further step B5, surface 13—which may have become slightly contaminated during soldering—is cleaned.

Figure 7:
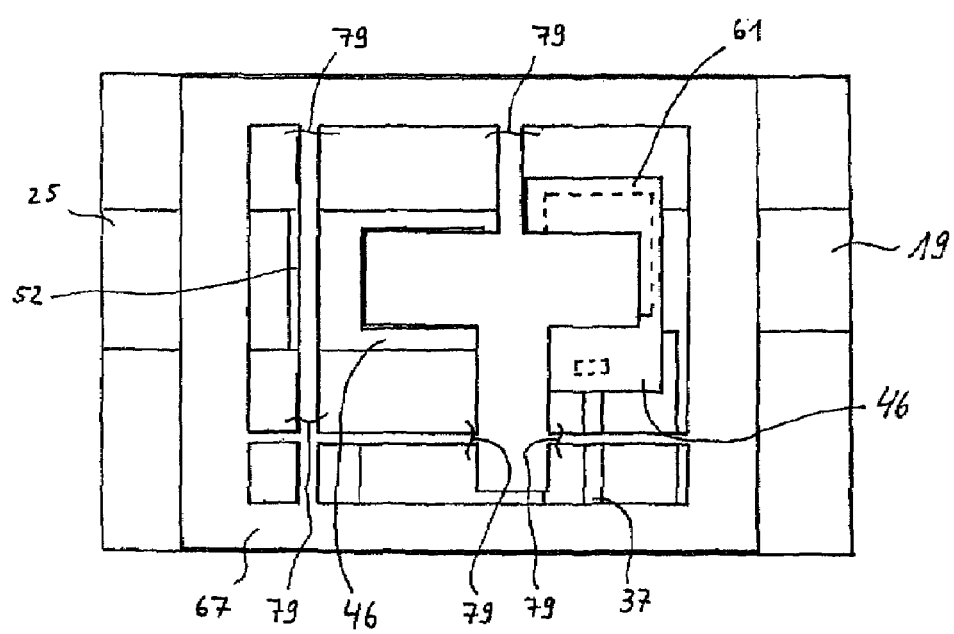
Figure 8:
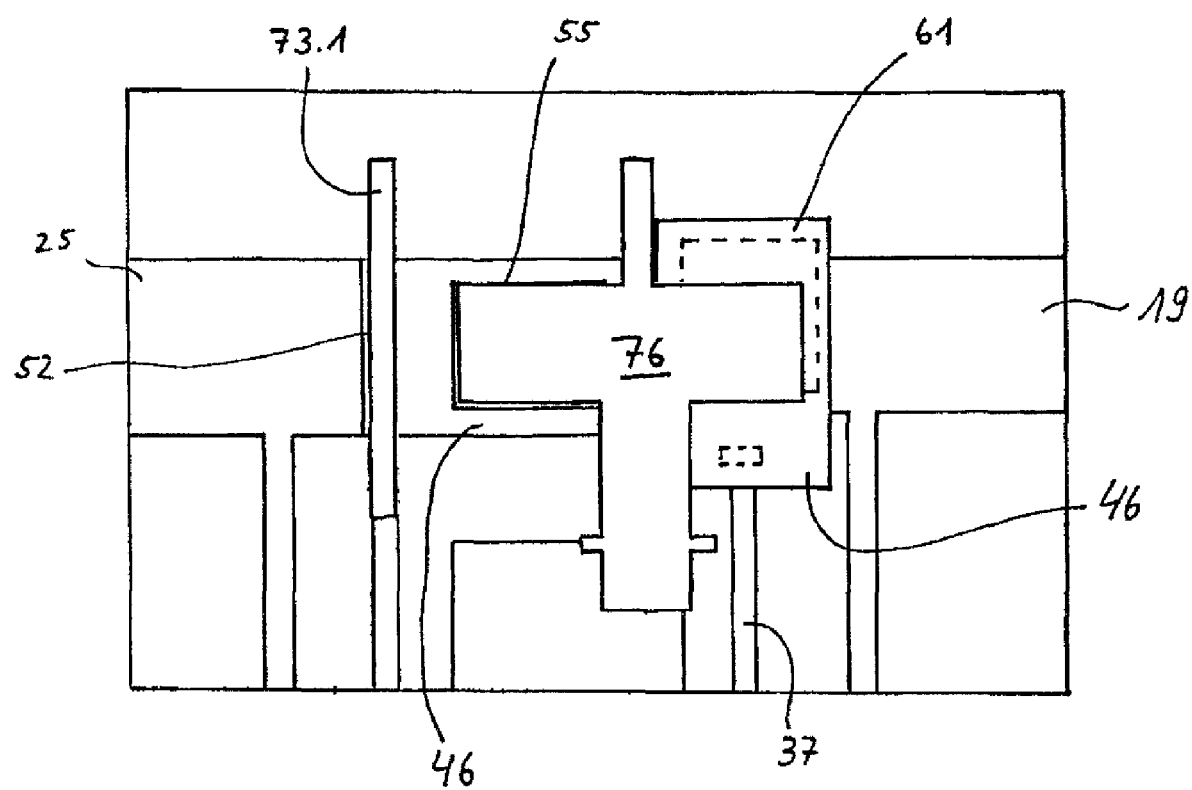

In method step B6 (see FIG. 7), connectors 73 are separated at the appropriate points, which are connections that serve no purpose in the circuit. Separation points 79 are shown in FIG. 7. In the final step, the part of lead frame 64 that is no longer required is removed. The finished circuit is shown in FIG. 8.

As an alternative to a lead frame made of a metal plate as described with reference to the previous figures, the lead frame can also be composed of a flat ceramic conductor carrier. With a conductor carrier of this type, solderable layers would only be applied, e.g., to the region of T-shaped connector 76 (see FIG. 5*a*) and connector 73.1, and a small section of connector 73.2 in the region of support surfaces 40.

In this case, semiconductor 46 shown on the right side in FIG. 4*b* would be one of two semiconductor chips 46 that would be mounted on conductor carrier 10 using the flip chip technique. The electronic circuit shown in the figures described above is an H-bridge circuit, which is provided to control electrical motors.

Lead frame 64—as a metallic, preferably copper connecting bridge—can be optimized in terms of thermomechanics, e.g., via the additional embossing described above, or by using suitable slots. For instance, this copper connecting bridge could connect the connections of the two transistors or semiconductors 46 in the shape of an omega.

In the steps described above, a method for manufacturing an electronic circuit is described, with which two semiconductor chips 46 are mounted on a surface 13 of a first conductor carrier 10 coated with strip conductors 16. Semiconductor chips 46 have essentially the same structure. Both semiconductor chips 46 have a first surface 49 and a second surface 58. One semiconductor chip 46—via its first surface 49—and the other semiconductor chip 46—via its second surface 58—are mounted on surface 13 of conductor carrier 10. Second surface 58 of the one semiconductor chip 46 and first surface 49 of the other semiconductor chip 46 are interconnected by a lead frame 64 with an A.C. power supply connection 31. It is also provided that, immediately after lead frame 64 is mounted on the semiconductor chips, connections 73 that serve no purpose in the circuit (i.e., short circuits) result between various contact points. In a subsequent step, the connections that serve no purpose in the circuit are severed. To obtain a lead frame 64 that is particularly resistant to vibration, it is provided that lead frame 64 is supported on support points 40 that are not integrated in the electronic circuit.

Lead frame 64 can be realized via two different possibilities: Using a metallic punched grid, which is preferably composed of copper, or using a second conductor carrier that is composed of insulating material—preferably ceramic, like conductor carrier 10—and is coated with strip conductors 16. It is provided that source connections 55 and gate connections 52 located on first surfaces 49 of semiconductor chips 64 are metallized before they are positioned on first conductor carrier 10.

What is claimed is:

1. A method for producing an electronic circuit with which two semiconductor chips (46) with essentially the same structure are mounted on a surface (13) of a first conductor carrier (10) coated with strip conductors (16); both semiconductor chips (46) have a first surface (49) and a second surface (58); one semiconductor chip (46) is mounted—via its first surface (49)—and the other semiconductor chip (46) is mounted— via its second surface (58)—on the conductor carrier surface (13); the second surface (58) of the first semiconductor chip (46) and the first surface (49) of the other semiconductor chip (46) are interconnected by a lead frame (64) with an A.C. power supply connection (31), wherein the lead frame (64) is supported on support points that support the lead frame (64) and are not integrated in the electronic circuit before the lead frame (64) is mounted on the semiconductor chips (46), wherein immediately after the lead frame (64) is mounted on the semiconductor chips (46), connections (73) that serve no purpose in the circuit result between various contact points at which the lead frame (64) contacts various circuit elements and between the support points at a time when the lead frame is connected to the contact points and the support points, and wherein the connections that serve no purpose in the circuit are severed in a subsequent step.

2. The method as recited in claim 1, wherein the lead frame (64) is composed of a metallic punched grid or a second conductor carrier made of insulating material and coated with strip conductors.

3. The method as recited in claim 1, wherein source connections (55) and gate connections (52) located on the second surfaces (58) of the semiconductor chips (46) are metalized before they are positioned on the first conductor carrier (10).

4. The method as recited in claim 1, wherein the electronic circuit is an H-bridge circuit.

5. The method as recited in claim 4, wherein, one of the two semiconductor chips (46) is mounted using flip chip technology.

* * * * *